United States Patent
Han et al.

(10) Patent No.: US 10,475,644 B2
(45) Date of Patent: *Nov. 12, 2019

(54) DIELECTRIC-METAL STACK FOR 3D FLASH MEMORY APPLICATION

(71) Applicant: Applied Materials, Inc., Santa Clara, CA (US)

(72) Inventors: Xinhai Han, Santa Clara, CA (US); Nagarajan Rajagopalan, Santa Clara, CA (US); Sung Hyun Hong, Fremont, CA (US); Bok Hoen Kim, San Jose, CA (US); Mukund Srinivasan, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 151 days.

This patent is subject to a terminal disclaimer.

(21) Appl. No.: 15/959,646

(22) Filed: Apr. 23, 2018

(65) Prior Publication Data

US 2018/0247808 A1    Aug. 30, 2018

Related U.S. Application Data

(63) Continuation of application No. 14/591,609, filed on Jan. 7, 2015, now Pat. No. 9,972,487.
(Continued)

(51) Int. Cl.
*H01L 21/02* (2006.01)
*H01L 27/11556* (2017.01)
*H01L 27/11582* (2017.01)

(52) U.S. Cl.
CPC .. *H01L 21/02274* (2013.01); *H01L 21/02164* (2013.01); *H01L 27/11556* (2013.01); *H01L 27/11582* (2013.01)

(58) Field of Classification Search
CPC ......... H01L 21/02274; H01L 21/02164; H01L 27/11556; H01L 27/11582
See application file for complete search history.

(56) References Cited

U.S. PATENT DOCUMENTS

| 5,341,016 A | 8/1994 | Prall et al. |
| 6,996,151 B1 | 2/2006 | Goossen |

(Continued)

FOREIGN PATENT DOCUMENTS

| CN | 103370745 A | 10/2013 |
| JP | 2011199177 A | 10/2011 |

(Continued)

OTHER PUBLICATIONS

International Search Report and Written Opinion from related application PCT/US2015/010313 dated Apr. 21, 2015.
(Continued)

*Primary Examiner* — John P. Dulka
(74) *Attorney, Agent, or Firm* — Patterson + Sheridan LLP (57) ABSTRACT

A method is provided for forming a stack of film layers for use in 3D memory devices. The method starts with providing a substrate in a processing chamber of a deposition reactor. Then one or more process gases suitable for forming a dielectric layer are supplied into the processing chamber of the deposition reactor forming a dielectric layer on the substrate. Then one or more process gases suitable for forming a metallic layer are supplied into the processing chamber of the deposition reactor forming a metallic layer on the dielectric layer. Then one or more process gases suitable for forming a metallic nitride adhesion layer are supplied into the processing chamber of the deposition
(Continued)

US 10,475,644 B2

Page 2 reactor forming a metallic nitride adhesion layer on the metallic layer. The sequence is then repeated to form a desired number of layers.

20 Claims, 4 Drawing Sheets

Related U.S. Application Data (60) Provisional application No. 61/929,794, filed on Jan. 21, 2014.

(56) References Cited

U.S. PATENT DOCUMENTS

| | | | |
|---|---|---|---|
| 8,076,250 | B1 | 12/2011 | Rajagopalan et al. |
| 8,709,551 | B2 | 4/2014 | Fox et al. |
| 8,817,514 | B2 | 8/2014 | Samachisa et al. |
| 9,029,256 | B2 | 5/2015 | Ramaswamy et al. |
| 9,972,487 | B2 * | 5/2018 | Han .......... H01L 21/02164 |
| 2009/0096012 | A1 | 4/2009 | Joo |
| 2011/0236594 | A1 | 9/2011 | Haverkamp et al. |
| 2012/0146128 | A1 | 6/2012 | Izumida et al. |
| 2012/0147650 | A1 | 6/2012 | Samachisa et al. |
| 2012/0319172 | A1 | 12/2012 | Ramaswamy et al. |
| 2013/0075684 | A1 | 3/2013 | Kinoshita et al. |
| 2013/0127011 | A1 | 5/2013 | Higashitani et al. |
| 2013/0161629 | A1 | 6/2013 | Han et al. |
| 2016/0293609 | A1 | 10/2016 | Jha et al. |
| 2016/0300845 | A1 | 10/2016 | Ishizaki et al. |
| 2017/0373079 | A1 | 12/2017 | Sharangpani et al. |

FOREIGN PATENT DOCUMENTS

| | | |
|---|---|---|
| JP | 2012-503336 A | 2/2012 |
| JP | 2012174866 | 9/2012 |
| JP | 2013546169 A | 12/2013 |
| KR | 10-2010-0048731 A | 5/2010 |
| TW | 201115576 A | 5/2011 |
| TW | 201222638 A | 6/2012 |
| WO | 2014011596 A1 | 1/2014 |

OTHER PUBLICATIONS

Taiwanese Office Action (with attached English translation of the Search Report) for Application No. 104101708; dated May 21, 2018; 8 total pages.
Chinese Office Action issued to Application No. 201580005195.1 dated May 30, 2018.
Japanese Office Action dated Dec. 14, 2018 for Application No. 2016-547595.

* cited by examiner

DIELECTRIC-METAL STACK FOR 3D FLASH MEMORY APPLICATION

CROSS-REFERENCE TO RELATED APPLICATIONS

This application is a continuation application of U.S. patent application Ser. No. 14/591,609, filed Jan. 7, 2015, claims benefit of U.S. Provisional Patent Application Ser. No. 61/929,794, filed Jan. 21, 2014, which is incorporated herein by reference.

FIELD

Aspects of the present invention relate generally to methods for forming stacks used in 3D flash memory.

BACKGROUND

Manufacturers of computer memory devices are ever in pursuit of smaller geometries with increased capacity at less cost. To this end, components of memory cells are commonly layered on top of each other to create 3D stacks.

Often, formation of these 3D memory stacks begins by alternating layers of a dielectric material and a conductive material, where the conductive material layer serves as the control gate for the transistors used in the memory cells of the flash memory. Polysilicon can be used as the conductive material, but using polysilicon presents problems such as polysilicon recess, silicidation, and wet stripping of metals.

Alternatively, formation of these 3D memory stacks may begin by alternating between a dielectric layer and a charge trapping layer, such as an oxide layer followed by a nitride layer. Silicon nitride can be used as the charge trapping material, but using silicon nitride as one of the initial layers in the stack presents the problem of nitride removal with defect control. Subsequently, metals, such as tungsten, or metallic compounds, such as titanium nitride, must generally be deposited in holes or channels formed in the stack, and conformal deposition of these metals or metallic compounds presents further challenges.

Therefore, a need exists for improved methods for 3D memory structures.

SUMMARY

In one embodiment, a method is provided for forming a stack of film layers for use in 3D memory devices, the method comprising a sequence of providing a substrate in a processing chamber of a deposition reactor, supplying one or more process gases suitable for forming a dielectric layer into the processing chamber of the deposition reactor, forming a dielectric layer on the substrate, supplying one or more process gases suitable for forming a metallic layer into the processing chamber of the deposition reactor, forming a metallic layer on the dielectric layer, supplying one or more process gases suitable for forming a metallic nitride adhesion layer into the processing chamber of the deposition reactor, forming a metallic nitride adhesion layer on the metallic layer. The sequence is then repeated to form a stack of a dielectric layer, followed by a metallic layer, followed by a metallic nitride adhesion layer.

In another embodiment, a method is provided for forming a stack of film layers for use in 3D memory devices, the method comprising a sequence of providing a substrate in a processing chamber of a deposition reactor, supplying one or more process gases suitable for forming an oxide layer into the processing chamber of the deposition reactor, forming an oxide layer on the substrate, supplying one or more process gases suitable for forming a tungsten layer into the processing chamber of the deposition reactor, forming a tungsten layer on the oxide layer, supplying one or more process gases suitable for forming a tungsten nitride adhesion layer into the processing chamber of the deposition reactor, forming a tungsten nitride adhesion layer on the tungsten layer. The sequence is then repeated to form a stack of an oxide layer, followed by a tungsten layer, followed by a tungsten nitride adhesion layer. After forming the stack of film layers for use in 3D memory devices further processes may include forming a plurality of holes in the stack, and conformally forming a material with a dielectric constant greater than silicon oxide in the plurality of holes.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Methods for forming stacks used in 3D flash memory are described that provide advantages in process integration and layer adhesion.

Figure 1:
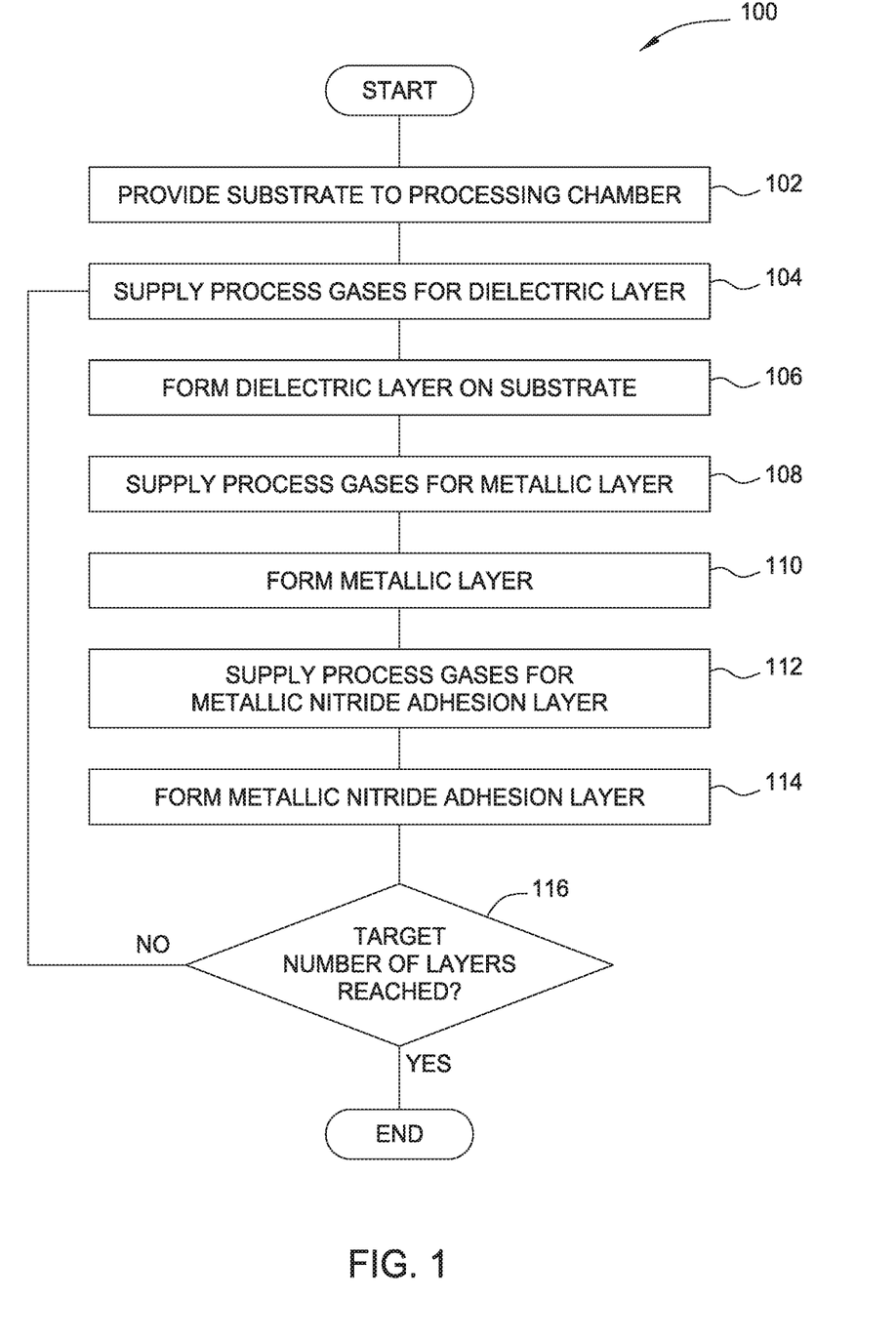
FIG. 1 is a process flow diagram according to one embodiment of the invention.
Figure 2:
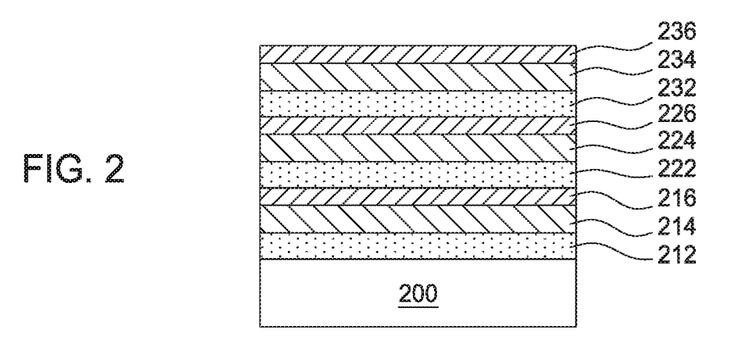
FIG. 2 illustrates a substrate treated according to one embodiment of the invention.

FIG. 1 is a process flow diagram summarizing a process 100 for forming a structure having a plurality of film layers. FIG. 2 is a cross-sectional view of a device made according to the process 100. In describing the process 100, reference will be made to features of FIG. 2. At 102, a substrate 200 is provided to a processing chamber of a deposition reactor. The deposition reactor may use chemical vapor deposition (CVD) or atomic layer deposition (ALD) and either deposition method may be plasma enhanced. The substrate is typically a structural member that provides a surface on which devices may be formed. As such, the substrate may be a semiconductor material such as silicon, germanium, or a compound semiconductor, a dielectric material such as glass, ceramic, or plastic, or a conductive material such as aluminum or another metal.

At 104, process gases suitable for forming a dielectric layer 212 are supplied to the processing chamber of the deposition reactor. The dielectric layer 212 could be an oxide, a nitride, an oxynitride, a phosphosilicate glass (PSG), a borosilicate glass (BSG), or a phosphoborosilicate glass (PBSG). An oxide layer may be made using a conventional tetraethoxysilane (TEOS)/oxygen gas mixture in a CVD or a plasma enhanced chemical vapor deposition (PECVD) process. A nitride layer may be made using a conventional organosilane/ammonia gas mixture. An oxynitride layer may be made using the TEOS/oxygen mixture with some ammonia added to the mixture. PSG, BSG, and PBSG may be made using the TEOS/oxygen gas mixture referred to above with phosphorous and/or boron dopant precursors, such as phosphine and borane (or their oligomers), added to the gas mixture. At 106, the dielectric layer 212 is formed on the substrate 200.

In one embodiment a PECVD process is used to form the dielectric layer 212, but other deposition methods may also be used. The gas mixture supplied to the processing chamber at 104 may be ionized into a plasma after being supplied to the processing chamber. The PECVD process may use high and low radio frequency (RF) power. The high frequency RF power may be supplied at a power level from about 50 Watts to about 2000 Watts at a frequency between about 1 MHz and about 20 MHz, such as about 13.56 MHz. The low frequency RF power may be supplied at a power level from about 30 Watts to about 1000 Watts at a frequency between about 200 kHz and about 1 MHz, for example about 350 kHz. DC or RF bias may be applied to the substrate at a power level between about 0 Watts and about 200 Watts, for example about 50 Watts. The RF power may be cycled or pulsed and may be continuous or discontinuous. During the deposition of the dielectric layer 212, the processing chamber of the deposition reactor may be maintained at a temperature between about 300° C. and about 650° C., for example, 450° C., and at a pressure of between about 0.5 Torr and 10 Torr, for example 5 Torr. The spacing between the showerhead and the substrate support pedestal during the deposition of the dielectric layer 212 may be between about 200 mils and about 1,000 mils, for example 400 mils.

At 108, process gases suitable for forming a metallic layer 214 are supplied to the processing chamber of the deposition reactor. The metallic layer 214 could be a layer of tungsten, aluminum, nickel, cobalt, tantalum, or titanium, an alloy of such metals, or a silicide of such metals. Process gases suitable for forming a metallic layer 214 could include hydrogen, a metallic compound including a metal from the group of metals consisting of tungsten, aluminum, nickel, cobalt, tantalum, or titanium, and an inert gas, for example argon or helium. At 110, the metallic layer 214 is formed on the dielectric layer 212. Metal precursors that may be used include organometallic compounds such as metal alkyls, an example of which is trimethylaluminum. Inorganic metal compounds, such as chlorides and fluorides, for example tungsten fluoride ($WF_6$), titanium chloride ($TiCl_4$), and the like, may also be used as metal precursors.

In one embodiment a PECVD process is used to form the metallic layer 214, but other deposition methods may be used. The gas mixture provided to the processing chamber at 108 may be ionized into a plasma after the gas mixture is supplied to the processing chamber. The PECVD process may use high and low frequency RF power. The high frequency RF power may be provided at a power level from about 100 Watts to about 1500 Watts at a frequency between about 1 MHz and about 20 MHz, for example about 13.56 MHz. The low frequency RF power may be provided at a power level from about 0 Watts to about 500 Watts at a frequency between about 200 kHz and about 1 MHz, for example about 350 kHz. DC or RF bias may be applied to the substrate at a power level between about 0 Watts and about 200 Watts, for example about 50 Watts. The RF power may be cycled or pulsed and may be continuous or discontinuous. During the deposition of the metallic layer 214, the processing chamber may be maintained at a temperature between about 300° C. and about 650° C., for example, 450° C., and at a pressure of between about 0.5 Torr and 50 Torr, for example 30 Torr. The spacing between the showerhead and the substrate support pedestal, during the deposition of the metallic layer 214, may be between about 200 mils and about 1,000 mils, for example 400 mils.

At 112, process gases suitable for forming a metallic nitride adhesion layer 216 are supplied to the processing chamber of the deposition reactor. The metallic nitride adhesion layer 216 could be a layer of tungsten nitride. Process gases suitable for forming a metallic nitride adhesion layer 216 could include ammonia, nitrogen, inert gases, and a metallic compound including a metal from the group consisting of tungsten, aluminum, nickel, cobalt, tantalum, or titanium. At 114, the metallic nitride adhesion layer 216 is formed on the metallic layer 214.

In one embodiment a PECVD is used to form the metallic nitride adhesion layer 216, but other deposition methods may be used. The gas mixture provided to the processing chamber at 112 may be ionized into a plasma after the gas mixture is supplied to the processing chamber. The PECVD process may use high and low frequency RF power. The high frequency RF power may be provided at a power level from about 45 Watts to about 2500 Watts at a frequency between about 1 MHz and about 20 MHz, for example about 13.56 MHz. The low frequency RF power may be provided at a power level from about 20 Watts to about 500 Watts at a frequency between about 200 kHz and about 1 MHz, for example about 350 kHz. DC or RF bias may be applied to the substrate at a power level between about 0 Watts and about 200 Watts, for example about 50 Watts. The RF power may be cycled or pulsed and may be continuous or discontinuous. During the deposition of the metallic nitride adhesion layer 216, the processing chamber may be maintained at a temperature between about 300° C. and about 650° C., for example, 450° C., and at a pressure of between about 0.5 Torr and 10 Torr, for example 7 Torr. The spacing between the showerhead and the substrate support pedestal during the deposition of the metallic nitride adhesion layer 216 may be between about 200 mils and about 800 mils, for example 300 mils.

In another embodiment, nitrogen may be added to the surface of a deposited metallic layer to form a metallic nitride adhesion layer such as the layer 216. A process such as plasma nitridation, with in-situ or remote plasma generation, may be used. A nitrogen precursor such as ammonia or nitrogen gas, or a mixture of nitrogen precursors, may be activated or ionized in-situ by methods described herein, and the active nitrogen precursor species may be contacted with the metallic layer 214 to form the metallic nitride layer 216. Alternately, nitrogen precursors may be activated or ionized in a separate chamber, and active nitrogen species may be flowed into the processing chamber and contacted with the metallic layer 214 to form the metallic nitride layer 216.

The metallic layer 214 may be thicker than the metallic nitride adhesion layer 216. The ratio of the thickness of the metallic layer 214 to the thickness of the metallic nitride adhesion layer 216 may be between about 5:1 and about 100:1, for example 25:1.

In certain embodiments a metallic nitride adhesion layer may be added between each dielectric layer and metallic layer. The metallic nitride adhesion layer may be formed according to a process similar to that described above in connection with forming the metallic nitride adhesion layer at 114. To add a metallic nitride adhesion layer to a dielectric layer prior to deposition of a metallic layer, a metallic nitride layer may be deposited on the dielectric layer by the operations referred to at 112 and 114. Thus, the operations 112 and 114 may be repeated between the operations 106 and 108 in some embodiments.

The process of forming a dielectric layer 212, a metallic layer 214, and a metallic nitride adhesion layer 216 may be repeated until the desired number of layers is reached as illustrated by decision operation 116. In the device of FIG. 2, additional layers have been formed by repeating the process. A second dielectric layer 222 is formed on the metallic nitride adhesion layer 216, a second metallic layer 224 is formed on the second dielectric layer 222, and a second metallic nitride adhesion layer 226 is formed on the second metallic layer 224. A third dielectric layer 232 is formed on the second metallic nitride adhesion layer 226, a third metallic layer 234 is formed on the third dielectric layer 232, and a third metallic nitride adhesion layer 236 is formed on the third metallic layer 234. It should be understood that additional layers may also be provided in practice. It should also be understood that the layers shown in the device of FIG. 2 may be provided in a reverse order from that shown in FIG. 2. Any number of layers may be provided by repeating the process any desired number of times. In some embodiments, the process may be repeated more than 50 times, or more than 100 times.

The processing chamber of the deposition reactor may be purged at any time, if desired, to provide a clean transition between deposition chemistries. For example, the processing chamber may be purged between forming the dielectric layer at 106 and supplying the process gases for the metallic layer at 108. The processing chamber may also be purged between forming the metallic layer at 110 and supplying the process gases for the metallic nitride adhesion layer at 112. The processing chamber may also be purged between forming the metallic nitride adhesion layer at 114 and supplying process gases for the dielectric layer at 104. Purging the processing chamber may be useful in some embodiments to provide a sharp transition from one layer to the next in devices such as that shown in FIG. 2. Alternatively, two or more processing chambers may be used. The processing chambers could be dedicated to forming a particular layer.

After the desired number of layers is reached at 116, the process can optionally continue to form a plurality of holes in the stack. The holes could be drilled or punched. Alternatively, cutting techniques may be used, such as dry etching. After the plurality of holes is formed, a plurality of channels may be created by depositing a conformal high k dielectric material inside the holes. High k dielectric materials include materials with a dielectric constant greater than silicon oxide, such as a metal oxide. Aluminum oxide and hafnium oxide are commonly used high-k gate dielectric materials.

Figure 3:
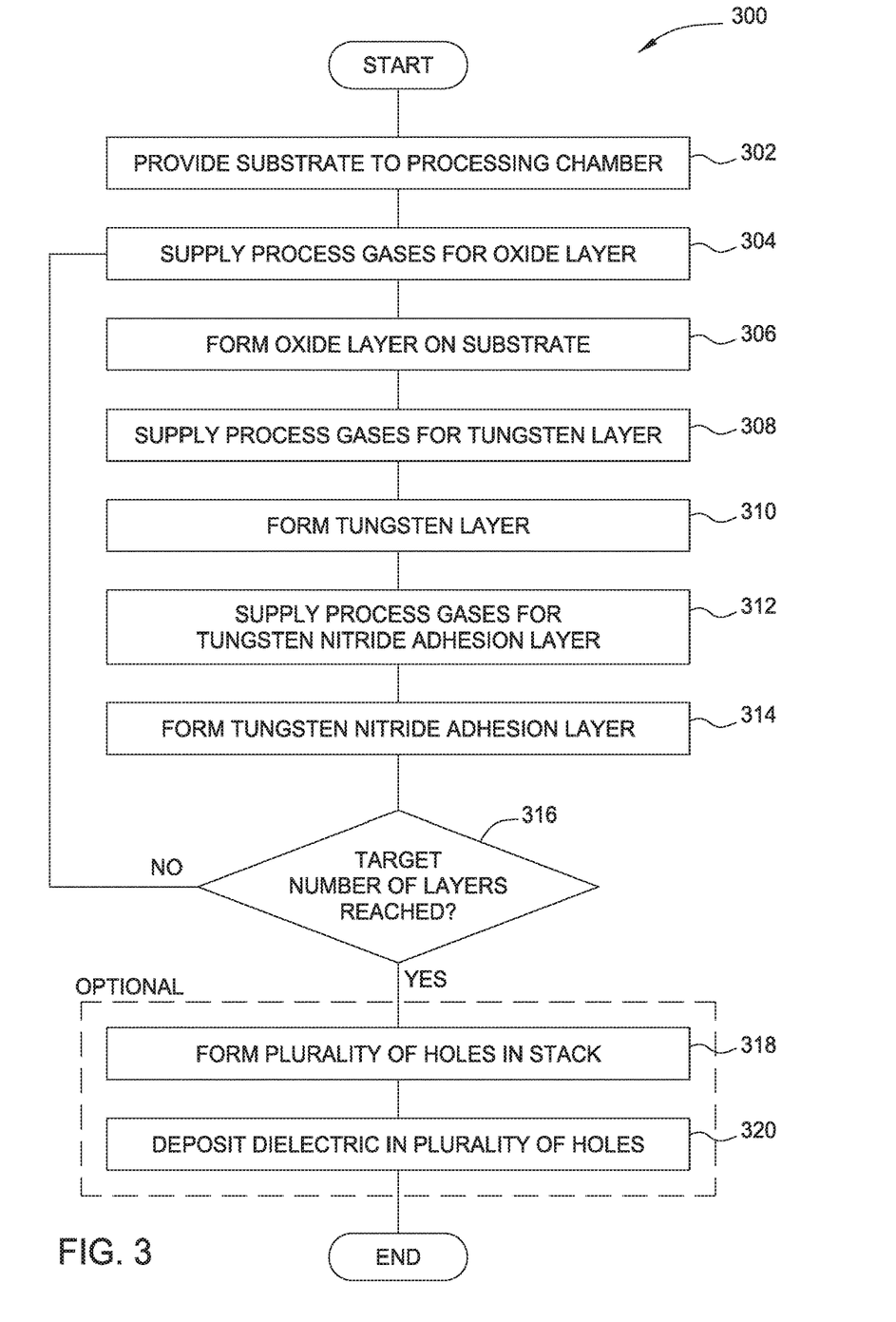
FIG. 3 is a process flow diagram according to another embodiment of the invention.
Figure 4A:
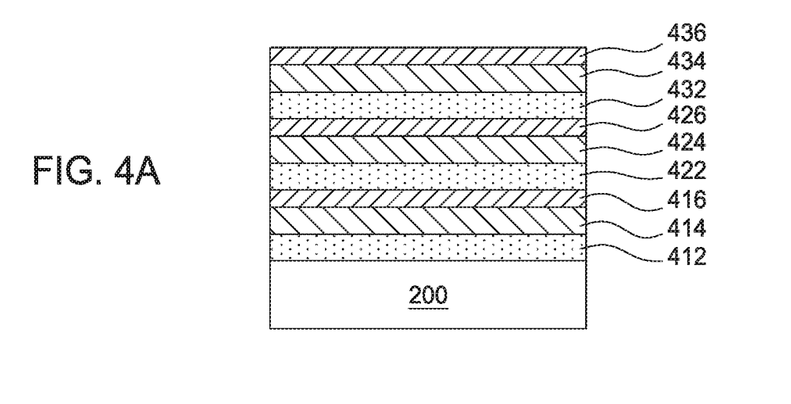
FIGS. 4A-4C illustrate a substrate treated according to another embodiment of the invention.

FIG. 3 is a process flow diagram summarizing a process 300 for forming a structure having a plurality of film layers. FIG. 4A is a cross sectional view of a device made according to the process 300. In describing the process 300, reference will be made to features of FIGS. 4A-4C. At 302, a substrate 200 is provided to a processing chamber of a deposition reactor. The deposition reactor may use CVD or ALD and either deposition method may be plasma enhanced. The substrate is typically a structural member that provides a surface on which devices may be formed. As such, the substrate may be a semiconductor material such as silicon, germanium, or a compound semiconductor, a dielectric material such as glass, ceramic, or plastic, or a conductive material such as aluminum or another metal.

At 304, process gases suitable for forming an oxide layer 412 are supplied to the processing chamber of the deposition reactor. The oxide layer 412 could be silicon oxide. If silicon oxide is the chosen oxide layer, then process gases suitable for forming the silicon oxide layer include a silicon precursor and an oxidizer. The silicon precursor could include at least one of silane or TEOS. The flow rate of silane may be from about 100 sccm to about 2,000 sccm, for example between about . . . 500 and 600 sccm. The flow rate of TEOS may be from about 500 mgm to about 10,000 mgm, for example 3,000 mgm. The oxidizer could include at least one of oxygen or nitrous oxide. The flow rate of the oxidizer may be from about 500 sccm to about 20,000 sccm. At 306, the oxide layer 412 is formed on the substrate 200.

In one embodiment a PECVD process is used to form the oxide layer 412, but other deposition methods may also be used. The gas mixture supplied to the processing chamber at 304 may be ionized into a plasma after being supplied to the processing chamber. The PECVD process may use high and low RF power. The high frequency RF power may be supplied at a power level from about 50 Watts to about 2000 Watts at a frequency between about 1 MHz and about 20 MHz, such as about 13.56 MHz. The low frequency RF power may be supplied at a power level from about 30 Watts to about 1000 Watts at a frequency between about 200 kHz and about 1 MHz, for example about 350 kHz. DC or RF bias may be applied to the substrate at a power level between about 0 Watts and about 200 Watts, for example about 50 Watts. The RF power may be cycled or pulsed and may be continuous or discontinuous. During the deposition of the oxide layer 412, the process chamber of the deposition reactor may be maintained at a temperature between about 300° C. and about 650° C., for example, 450° C., and at a pressure of between about 0.5 Torr and 10 Torr, for example 5 Torr. The spacing between the showerhead and the substrate support pedestal during the deposition of the oxide layer 412 may be between about 200 mils and about 1,000 mils, for example 400 mils.

At 308, process gases suitable for forming a tungsten layer 414 are supplied to the processing chamber of the deposition reactor. Process gases suitable for forming a tungsten layer could include tungsten hexafluoride ($WF_6$) hydrogen, and an inert gas, for example argon or helium. The flow rate of $WF_6$ may be from about 100 sccm to about 2,000 sccm, for example between about 500 and 600 sccm. The flow rate of hydrogen may be from about 500 sccm to about 20,000 sccm, for example 7,500 sccm. At 310, the tungsten layer 414 is formed on the oxide layer 412.

In one embodiment a PECVD process is used to form the tungsten layer 414, but other deposition methods may be used. The gas mixture provided to the processing chamber at 308 may be ionized into a plasma after the gas mixture is supplied to the processing chamber. The PECVD process may use high and low frequency RF power. The high frequency RF power may be provided at a power level from about 100 Watts to about 1500 Watts at a frequency between about 1 MHz and about 20 MHz, for example about 13.56 MHz. The low frequency RF power may be provided at a power level from about 0 Watts to about 500 Watts at a frequency between about 200 kHz and about 1 MHz, for example about 350 kHz. DC or RF bias may be applied to the substrate at a power level between about 0 Watts and about 200 Watts, for example about 50 Watts. The RF power may be cycled or pulsed and may be continuous or discontinuous. During the deposition of the tungsten layer 414, the processing chamber of the deposition reactor may be maintained at a temperature between about 300° C. and about 650° C., for example, 450° C., and at a pressure of between about 0.5 Torr and 50 Torr, for example 30 Torr. The spacing between the showerhead and the substrate support pedestal during the deposition of the tungsten layer 414 may be between about 200 mils and about 1,000 mils, for example 400 mils.

At 312, process gases suitable for forming a tungsten nitride adhesion layer 416 are supplied to the processing chamber of the deposition reactor. Process gases suitable for forming a tungsten nitride adhesion layer 416 could include tungsten hexafluoride, ammonia, hydrogen, nitrogen, and an inert gas, for example argon or helium. The flow rate of $WF_6$ may be from about 100 sccm to about 2,000 sccm, for example between about 500 and 600 sccm. The flow rate of hydrogen may be from about 0 sccm to about 20,000 sccm, for example 7,500 sccm. The flow rate of ammonia may be from about 100 sccm to about 10,000 sccm, for example 4,500 sccm. The flow rate of nitrogen and/or helium and/or argon may be from about 1,000 sccm to about 20,000 sccm, for example 12,500 sccm. At 314, the tungsten nitride adhesion layer 416 is formed on the tungsten layer 414.

In one embodiment a PECVD process is used to form the tungsten nitride adhesion layer 416, but other deposition methods may also be used. The gas mixture supplied to the processing chamber at 312 may be ionized into a plasma after being supplied to the processing chamber. The PECVD process may use high and low RF power. The high frequency RF power may be supplied at a power level from about 45 Watts to about 2500 Watts at a frequency between about 1 MHz and about 20 MHz, such as about 13.56 MHz. The low frequency RF power may be provided at a power level from about 20 Watts to about 500 Watts at a frequency between about 200 kHz and about 1 MHz, for example about 350 kHz. DC or RF bias may be applied to the substrate at a power level between about 0 Watts and about 200 Watts, for example about 50 Watts. The RF power may be cycled or pulsed and may be continuous or discontinuous. During the deposition of the tungsten nitride adhesion layer 416, the processing chamber of the deposition reactor may be maintained at a temperature between about 300° C. and about 650° C., for example 450° C., and at a pressure of between about 0.5 Torr and 10 Torr, for example 7 Torr. The spacing between the showerhead and the substrate support pedestal during the deposition of the tungsten layer 414 may be between about 200 mils and about 800 mils, for example 300 mils.

The tungsten layer 414 may be thicker than the tungsten nitride adhesion layer 416. The ratio of the thickness of the tungsten layer 414 to the thickness of the tungsten nitride adhesion layer 416 may be between about 5:1 and about 100:1, for example 25:1.

In certain embodiments a tungsten nitride adhesion layer may be added between each oxide and tungsten layer. The tungsten nitride adhesion layer may be formed according to a process similar to that described above in connection with forming the tungsten nitride adhesion layer at 314. Thus, in some embodiments, the operations at 312 and 314 may be repeated between the operations at 306 and 308.

The process of forming an oxide layer 412, a tungsten layer 414, and a tungsten nitride adhesion layer 416 may be repeated until the desired number of layers is reached as illustrated by decision operation 316. In the device of FIG. 4A additional layers have been formed by repeating the process. A second oxide layer 422 is formed on tungsten nitride adhesion layer 416, a second tungsten layer 424 is formed on the second oxide layer 422, and then a second tungsten nitride adhesion layer 426 is formed on the second tungsten layer 424. A third oxide layer 432 is formed on the second tungsten nitride adhesion layer 426, a third tungsten layer 434 is formed on the third oxide layer 432, and then a third tungsten nitride adhesion layer 436 is formed on the third tungsten layer 434. It should be understood that additional layers may also be provided in practice. It should also be understood that the layers shown in the device of FIG. 4A may be provided in a reverse order from that shown in FIG. 4A. Any number of layers may be provided by repeating the process any desired number of times. In some embodiments, the process may be repeated more than 50 times, or more than 100 times.

The processing chamber of the deposition reactor may be purged at any time, if desired, to provide a clean transition between deposition chemistries. For example, the processing chamber may be purged between forming the oxide layer at 306 and supplying the process gases for the tungsten layer at 308. The processing chamber may also be purged between forming the tungsten layer at 310 and supplying the process gases for the tungsten nitride adhesion layer at 312. The processing chamber may also be purged between forming the tungsten nitride adhesion layer at 314 and supplying process gases for the oxide layer at 304. Purging the processing chamber may be useful in some embodiments to provide a sharp transition from one layer to the next in devices such as that shown in FIG. 4A. Alternatively, two or more processing chambers may be used. The processing chambers could be dedicated to forming a particular layer.

Figure 4B:
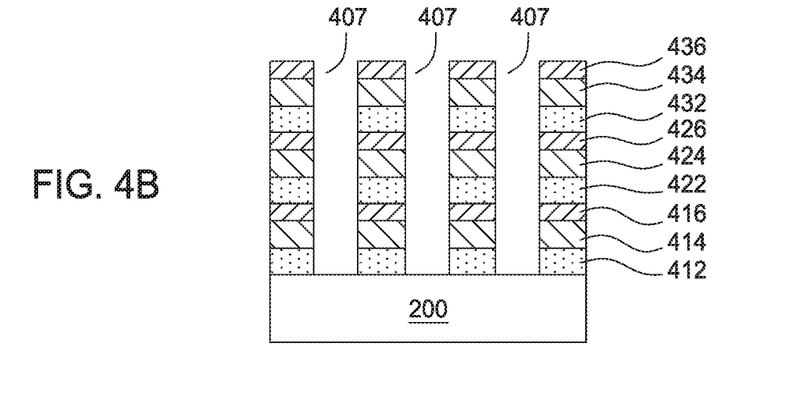
Figure 4C:
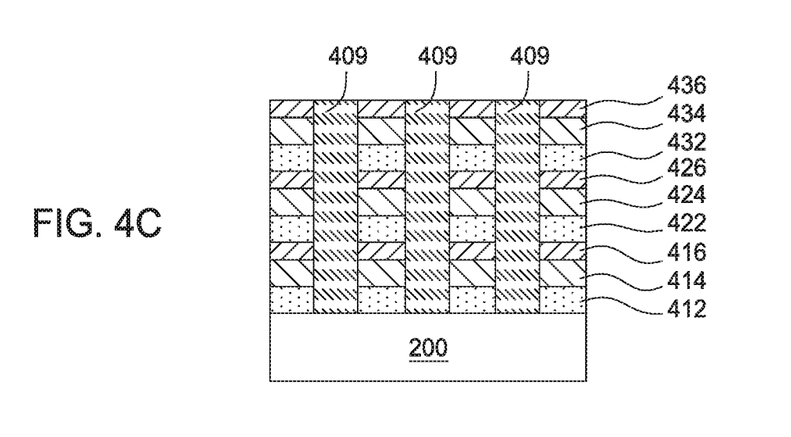

After the desired number of layers is reached at 316, the process can optionally continue at 318 and 320. FIGS. 4B and 4C correspond to these additional process operations. At 318, a plurality of holes 407 is made in the stack. The holes could be drilled or punched. Alternatively, cutting techniques may be used, such as dry etching. At 320, a plurality of channels 409 is created by depositing conformal high k dielectric material inside the holes 407. High k dielectric materials include materials with a dielectric constant greater than silicon oxide, such as a metal oxide. Aluminum oxide and hafnium oxide are commonly used high-k gate dielectric materials.

The processes described herein may be performed using any of the PRODUCER® chambers available from Applied Materials, Inc., of Santa Clara, Calif. Processing chambers from other manufacturers may be used as well.

While the foregoing is directed to embodiments of the present invention, other and further embodiments of the invention may be devised without departing from the basic scope thereof, and the scope thereof is determined by the claims that follow.

The invention claimed is:

1. A method for forming a 3D memory device in a processing chamber, the method comprising:
   (a) performing a dielectric layer deposition process to form a first dielectric layer on a substrate;
   (b) performing a metallic layer deposition process to form a first metallic layer on the first dielectric layer;
   (c) performing a metallic nitride adhesion layer deposition process to form a first metallic nitride adhesion layer on the first metallic layer;
   (d) performing a second dielectric layer deposition process to form a second dielectric layer on the first metallic nitride adhesion layer;
   (e) performing a second metallic layer deposition process to form a second metallic layer on the second dielectric layer; and (f) performing a second metallic nitride adhesion layer deposition process to form a second metallic nitride adhesion layer on the second metallic layer, wherein performing operations (a)-(f) forms a stack of a plurality of layers.

2. The method of claim 1, further comprising: repeating operations (a)-(f) one or more times.

3. The method of claim 2, wherein operations (a)-(f) are repeated at least 25 times.

4. The method of claim 2, wherein operations (a)-(f) are repeated at least 50 times.

5. The method of claim 1, wherein performing the dielectric layer deposition process comprises supplying one or more first process gases into the processing chamber, wherein performing the metallic layer deposition process comprises supplying one or more second process gases into the processing chamber, and wherein performing the metallic nitride adhesion layer deposition process comprises supplying one or more third process gases into the processing chamber.

6. The method of claim 5, further comprising:
ionizing the one or more first process gases supplied to form the first dielectric layer into a plasma inside the processing chamber;
ionizing the one or more second process gases supplied to form the first metallic layer into a plasma after the one or more second process gases supplied to form the first metallic layer is supplied to the processing chamber; and
ionizing the one or more third process gases supplied to form the first metallic nitride adhesion layer into a plasma after the one or more third process gases supplied to form the first metallic nitride adhesion layer is supplied to the processing chamber.

7. The method of claim 5, wherein the one or more first process gases supplied to form the first dielectric layer comprises at least one of silane or tetraethoxysilane and at least one of oxygen or nitrous oxide.

8. The method of claim 5, wherein the one or more second process gases supplied to form the first metallic layer comprises hydrogen, an inert gas, and a metallic compound including a metal selected from the group consisting of tungsten, aluminum, nickel, cobalt, tantalum, and titanium.

9. The method of claim 5, wherein the one or more third process gases supplied to form the first metallic nitride adhesion layer comprises hydrogen, ammonia, one or more of nitrogen and a dilution gas that is inert, and a metallic compound including a metal selected from the group consisting of tungsten, aluminum, nickel, cobalt, tantalum, and titanium.

10. The method of claim 1, wherein the first dielectric layer and the second dielectric layer comprise a material selected from the group consisting of an oxide, a nitride, an oxynitride, a phosphosilicate glass, a borosilicate glass, a phosphoborosilicate glass, and derivatives thereof.

11. The method of claim 1, wherein the first metallic layer and the second metallic layer comprise a material selected from the group consisting of tungsten, aluminum, nickel, cobalt, tantalum, titanium, silicides thereof, alloys thereof, and derivatives thereof.

12. The method of claim 1, wherein the first metallic layer and the second metallic layer have a first thickness, the first metallic nitride adhesion layer and the second metallic nitride adhesion layer have a second thickness, and a ratio of the first thickness to the second thickness is between about 5:1 and about 100:1.

13. A method for forming 3D memory devices in a processing chamber, the method comprising:
(a) performing an oxide layer deposition process to form a first oxide layer on a substrate;
(b) performing a tungsten layer deposition process to form a first tungsten layer on the first oxide layer;
(c) performing a nitride adhesion layer deposition process to form a first nitride adhesion layer on the first tungsten layer;
(d) performing the oxide layer deposition process to form a second oxide layer on the first nitride adhesion layer;
(e) performing the tungsten layer deposition process to form a second tungsten layer on the second oxide layer; and
(f) performing the nitride adhesion layer deposition process to form a second nitride adhesion layer on the second tungsten layer, wherein performing operations (a)-(f) forms a stack of a plurality of layers.

14. The method of claim 13, further comprising: repeating operations (a)-(f) one or more times.

15. The method of claim 14, further comprising:
forming a plurality of holes in the stack of the plurality of layers after the stack of the plurality of layers has been formed; and
conformally depositing a high k dielectric material in each hole of the plurality of holes.

16. The method of claim 14, wherein operations (a)-(f) are repeated at least 25 times.

17. The method of claim 14, wherein operations (a)-(f) are repeated at least 50 times.

18. The method of claim 13, wherein performing the oxide layer deposition process comprises supplying one or more first process gases into the processing chamber, wherein performing the tungsten layer deposition process comprises supplying one or more second process gases into the processing chamber, and wherein performing the nitride adhesion layer deposition process comprises supplying one or more third process gases into the processing chamber.

19. The method of claim 18, further comprising:
ionizing each of the one or more first process gases supplied to form the first oxide layer and the second oxide layer into a plasma;
ionizing each of the one or more second process gases supplied to form the first tungsten layer and the second tungsten layer into a plasma; and
ionizing each of the one or more third process gases supplied to form the first nitride adhesion layer and the second nitride adhesion layer into a plasma.

20. A method for forming 3D memory devices, the method comprising:
positioning a substrate in a processing chamber;
forming a stack of a plurality of layers on the substrate, the forming comprising:
ionizing a first process gas to form an oxide layer,
ionizing a second process gas to form a tungsten layer on the oxide layer; and
ionizing a third process gas to form a tungsten nitride adhesion layer on the tungsten layer; and
repeating the forming of the stack of the plurality of layers.

* * * * *